US008457694B2

(12) United States Patent
Sung et al.

(10) Patent No.: US 8,457,694 B2
(45) Date of Patent: Jun. 4, 2013

(54) SIDE KEY FLEXIBLE CIRCUIT BOARD FOR MOBILE TELECOMMUNICATION TERMINAL

(75) Inventors: Chang Gui Sung, Anyang-si (KR); Hyung Lae Lee, Seoul (KR); Myung Sun Kim, Daegu-si (KR)

(73) Assignee: LG Electronics Inc., Seoul (KR)

( * ) Notice: Subject to any disclaimer, the term of this patent is extended or adjusted under 35 U.S.C. 154(b) by 1481 days.

(21) Appl. No.: 11/626,776

(22) Filed: Jan. 24, 2007

(65) Prior Publication Data

US 2007/0171208 A1 Jul. 26, 2007

(30) Foreign Application Priority Data

Jan. 24, 2006 (KR) .................. 10-2006-0007235

(51) Int. Cl.
*H04M 1/00* (2006.01)
*H05K 1/00* (2006.01)

(52) U.S. Cl.
USPC .................. 455/575.1; 361/748; 361/749

(58) Field of Classification Search
USPC ....................................... 455/575.1
See application file for complete search history.

(56) References Cited

U.S. PATENT DOCUMENTS

| 4,560,844 | A | * | 12/1985 | Takamura et al. | ............. 200/5 A |
| 5,544,015 | A | * | 8/1996 | Akami | ............................ 361/749 |
| 5,850,996 | A | * | 12/1998 | Liang | ........................ 248/221.11 |
| 5,969,644 | A | * | 10/1999 | Koutaka | ............................ 341/22 |

* cited by examiner

*Primary Examiner* — Melody Mehrpour
*Assistant Examiner* — Natasha Cosme
(74) *Attorney, Agent, or Firm* — Lee, Hong, Degerman, Kang & Waimey

(57) ABSTRACT

The present invention relates to an apparatus for supporting a function key of a mobile communication terminal. The apparatus includes a flexible printed circuit for electrically connecting a plurality of function keys to the mobile communication terminal, wherein the flexible printed circuit is conformable to a shape of a mounting space the plurality of function keys are mounted in, and a plurality of supporting members, wherein each supporting member corresponds to at least one of the plurality of function keys for supporting the at least one of the plurality of function keys within the mounting space, wherein the flexible printed circuit connects the plurality of supporting members to each other by attaching to a surface of the supporting members.

9 Claims, 10 Drawing Sheets

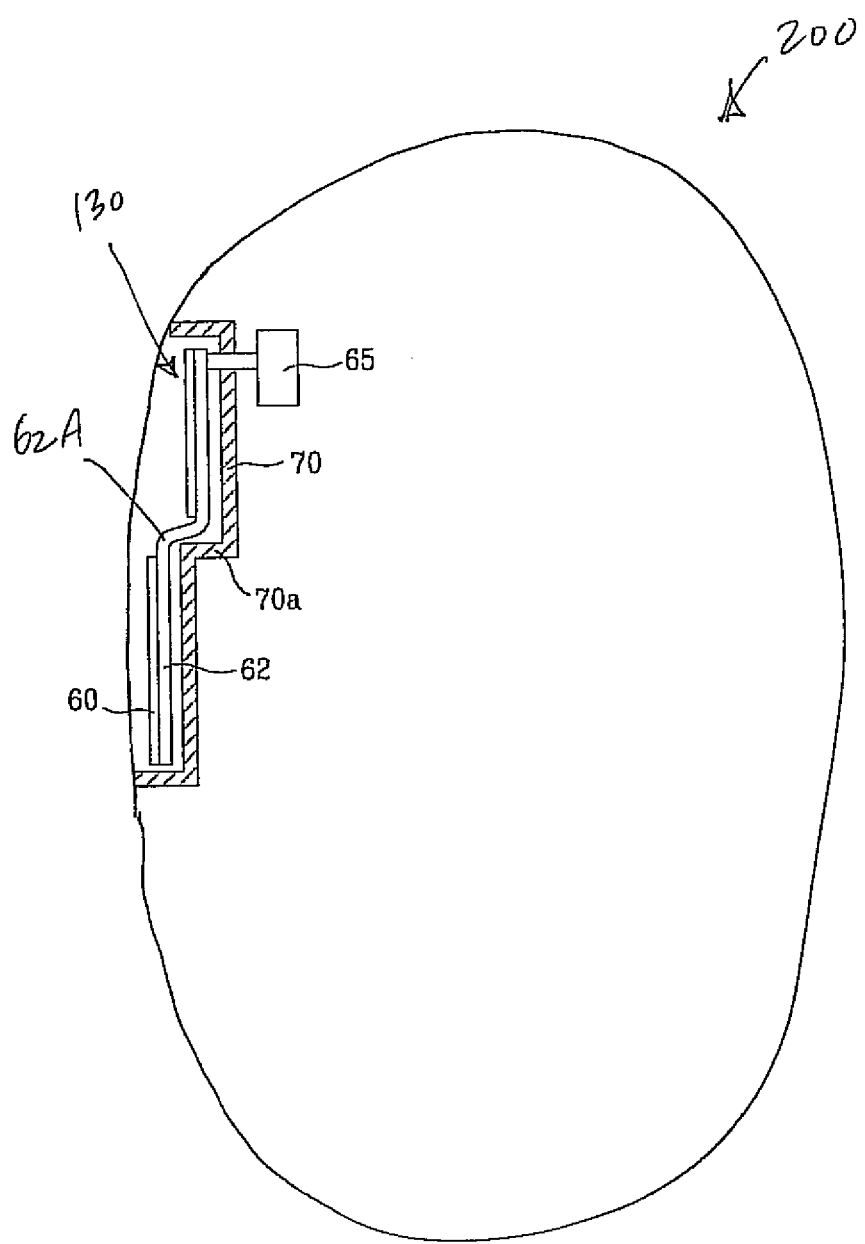

SIDE KEY FLEXIBLE CIRCUIT BOARD FOR MOBILE TELECOMMUNICATION TERMINAL

CROSS-REFERENCE TO RELATED APPLICATIONS

Pursuant to 35 U.S.C. §119(a), this application claims the benefit of earlier filing date and right of priority to Korean Application No. 10-2006-0007235, filed on Jan. 24, 2006, the contents of which are hereby incorporated by reference herein in their entirety.

FIELD OF THE INVENTION

The present invention relates to a mobile telecommunication terminal, and more particularly, to a side key flexible printed circuit board (FPCB) installed at a side of the mobile telecommunication terminal.

BACKGROUND OF THE INVENTION

Generally, a plurality of side keys may be installed on side surfaces of various mobile telecommunication terminals, such as cellular phones and PCS phones, for serving as function keys to subsidize functions of main keys. FIG. 1 is a perspective view of a conventional folder-type mobile telecommunication terminal. FIG. 2 is a partial perspective view of a side key portion of the mobile telecommunication terminal shown in FIG. 1. The mobile telecommunication terminal 1, as shown in FIGS. 1 and 2, comprises a first body 10 housing a main printed circuit board (PCB) 16 and a second body 20 including a liquid crystal display (LCD) panel 21 for displaying various data thereon, wherein the second body 20 is rotatably connected to the first body 10.

A speaker 22 for outputting audio data is provided at one side of the LCD panel 21. A rotatable hinge unit 23 for rotatably connecting the second body 20 to the first body 10 is formed at the other side of the LCD panel 21. A plurality of main keys 11 and a plurality of side keys 14 are respectively disposed on an upper surface and a side surface of the first body 10. A microphone 13 for inputting audio data is provided at a lower end of the first body 10 adjacent to the plurality of main keys 11.

Fixed hinge units 12 for rotatably connecting the second body 20 to the first body 10 are formed at an upper end of the first body 10. A battery 15 for supplying power to the mobile telecommunication terminal is detachably connected to a rear surface of the first body 10.

A plurality of input switches 17 are disposed at a side portion of the main PCB 16. The plurality of input switches 17 are operationally connected to the plurality of side keys 14, respectively, such that when one of the side keys 14 is pressed by a user, a corresponding input switch 17 is activated by the user-pressed side key. Accordingly, the user may use the side keys 14 to input signals into the mobile telecommunication terminal, such as when inputting a signal to adjust a tone during telephonic communication. A key pad 18, made of rubber, and having a plurality of key portions 19 corresponding to the main keys 11, is connected to an upper surface of the main PCB 16. The plurality of key portions 19 are operationally connected to the plurality of main keys, respectively, such that when one of the main keys 11 is pressed by the user, a corresponding key portion 19 is activated by the user-pressed main key.

FIG. 3 is a perspective view of a conventional side key flexible printed circuit board (FPCB) 30. FIG. 4 is a partial perspective view of the side key FPCB 30 shown in FIG. 3, which is connected to the first body 10. The side key FPCB 30 is operationally connected with the side keys 14, such that when the side keys 14 are pressed by the user, the side key FPCB 30 is activated to input signals into the mobile telecommunication terminal. In order to manipulate the side key FPCB 30, the side key FPCB 30 must be structurally supported by a rib 40, which may formed into the first body 10 by injection molding.

FIG. 5 is a schematic view illustrating a general structure of the side key FPCB 30. FIG. 6 is a side view illustrating an installed state of the side key FPCB 30 shown in FIG. 5. A back plate 31 made of stainless steel is attached to one side surface of a double-sided tape 32. A flexible printed circuit (FPC) 33 is attached to the other side surface of the double-sided tape 32. One end of the FPC 33 passes through the rib 40, and is operationally fixed to a portion of the main PCB 16 (FIG. 2) by soldering at soldering point 36. Here, reference numeral 34 represents dimple domes attached to a side surface of the FPC 33 with double-sided tape (not shown) and reference numeral 35 represents a PET film.

The side key FPCB 30 is sensitive to manipulation. Accordingly, under the condition that the back plate 31 made of a hard material is attached to the FPC 33, the rib 40 supports the side key FPCB 30 and controls the manipulation of the FPCB 30.

FIG. 7 is a schematic view illustrating a shape of the rib 40 applied to a straight side key FPCB and used by a mobile communication terminal having straight side surfaces. FIG. 8 is a schematic view illustrating a shape of a rib 50 applied to a straight side key FPCB and used by a mobile telecommunication terminal having curved side surfaces.

Compared to the rib 40 shown in FIG. 7, the rib 50 shown in FIG. 8 requires a large space for the straight side key FPCB 30 to occupy. Thus, an area on the main PCB 16 for mounting components is decreased. Accordingly, it is difficult to apply the straight side key FPCB 30 to the mobile telecommunication terminal having the curved side surfaces. Nonetheless, an attempt to solve the above problem has been proposed wherein a separable straight side key FPCB is applied to the mobile telecommunication terminal having the curved side surfaces.

However, if the separable straight side key FPCB is applied, the number of soldering points are increased from one to two or more, which increases the possibility of connectivity problems. Moreover, data processing using the separable straight side key FPCP is more complicated compared to data processing using a solid straight side key FPCB.

Also, the above straight FPCB 30 has been used in conventional box-shaped mobile communication terminals. But, as circular or curved mobile communication terminals have been put out into the market, a separable tact switch or a plurality of side key FPCBs are used to manipulate the side keys 14 of the terminals. However, due to its lack of reliability, the tact switch is no longer used. Furthermore, when the plurality of side key FPCBs are used, the usable region of the first body 10 is decreased and data processing must be separated.

Accordingly, it is the object of the present invention to provide side key FPCB that overcomes the problems of the related art.

SUMMARY OF THE INVENTION

The present invention is directed to an apparatus for supporting a function key of a mobile telecommunication terminal.

Preferably, an object of the present invention is to provide a side key flexible printed circuit board (FPCB) having a flexible portion, which can be applied to mobile telecommunication terminals having various shapes, and a mobile telecommunication terminal having the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for supporting a function key of a mobile communication terminal comprises a flexible printed circuit for electrically connecting a plurality of function keys to the mobile communication terminal, wherein the flexible printed circuit is conformable to a shape of a mounting space the plurality of function keys are mounted in, and a plurality of supporting members, wherein each supporting member corresponds to at least one of the plurality of function keys for supporting the at least one of the plurality of function keys within the mounting space, wherein the flexible printed circuit connects the plurality of supporting members to each other by attaching to a surface of the supporting members.

In one aspect of the present invention, the apparatus further comprises a rib for structurally supporting at least one set of function keys within the mounting space. Preferably, a shape of the rib corresponds to the shape of the mounting space the plurality of function keys are mounted in.

Preferably, the flexible printed circuit comprises a bending portion located between each of the plurality of supporting members. Furthermore, a rib for structurally supporting at least one of a plurality of function keys within the mounting space comprises a bending portion corresponding to each bending portion of the flexible printed circuit.

Preferably, the flexible printed circuit is electrically connected to the mobile communication terminal at one point. Moreover, the plurality of function keys are electrically connected to the mobile communication terminal via the one point. Preferably, the rib has a curved shape.

In another aspect of the present invention, the apparatus further comprises dimple domes mounted on the flexible printed circuit for electrically connecting the plurality of function keys to the flexible printed circuit. Preferably, the dimple domes are mounted onto the flexible printed circuit by a PET film coating. Preferably, the flexible printed circuit attaches to the plurality of supporting members via an adhesive.

In accordance with another embodiment of the present invention, a mobile communication terminal comprises a body, a plurality of first function keys formed on a first surface of the body for inputting data, a display formed on the body for displaying information of the mobile communication terminal, a plurality of second function keys formed on a second surface of the body for inputting data, and a second function key apparatus for supporting the plurality of second function keys. Preferably, the second function key apparatus comprising a flexible printed circuit for electrically connecting the plurality of second function keys to the mobile communication terminal, wherein the flexible printed circuit is conformable to a shape of a mounting space the plurality of second function keys are mounted in, and a plurality of supporting members, wherein each supporting member corresponds to at least one of a plurality of second function keys for supporting the at least one of the plurality of second function keys within the mounting space, wherein the flexible printed circuit connects the plurality of supporting members to each other by attaching to a surface of the supporting members.

In one aspect of the present invention, the mobile communication terminal further comprises a rib for structurally supporting the at least one of the plurality of second function keys within the mounting space. Preferably, a shape of the rib corresponds to the shape of the mounting space the plurality of second function keys are mounted in.

Preferably, the flexible printed circuit comprises a bending portion located between each of the plurality of supporting members. Moreover, a rib for structurally supporting at least one of the plurality of second function keys within the mounting space comprises a bending portion corresponding to each bending portion of the flexible printed circuit.

Preferably, the flexible printed circuit is electrically connected to the mobile communication terminal at one point. Furthermore, the plurality of second function keys are electrically connected to the mobile communication terminal via the one point. Preferably, the rib has a curved shape.

In another aspect of the present invention, the mobile communication terminal further comprises dimple domes mounted on the flexible printed circuit for electrically connecting the plurality of second function keys to the flexible printed circuit. Preferably, the dimple domes are mounted onto the flexible printed circuit by a PET film coating.

Preferably, the flexible printed circuit attaches to the plurality of supporting members via an adhesive. Furthermore, the plurality of second function keys are formed on a side surface of the body.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIG. 13 is a schematic view illustrating a shape of a rib applied to a bendable side key FPCB in accordance with one embodiment of the present invention.

DETAILED DESCRIPTION OF THE PREFERRED EMBODIMENTS

The present invention relates to a side key flexible circuit board for a mobile telecommunication terminal. Reference will now be made in detail to the preferred embodiments of the present invention, examples of which are illustrated in the accompanying drawings. Wherever possible, the same reference numbers will be used throughout the drawings to refer to the same or like parts.

Figure 1:
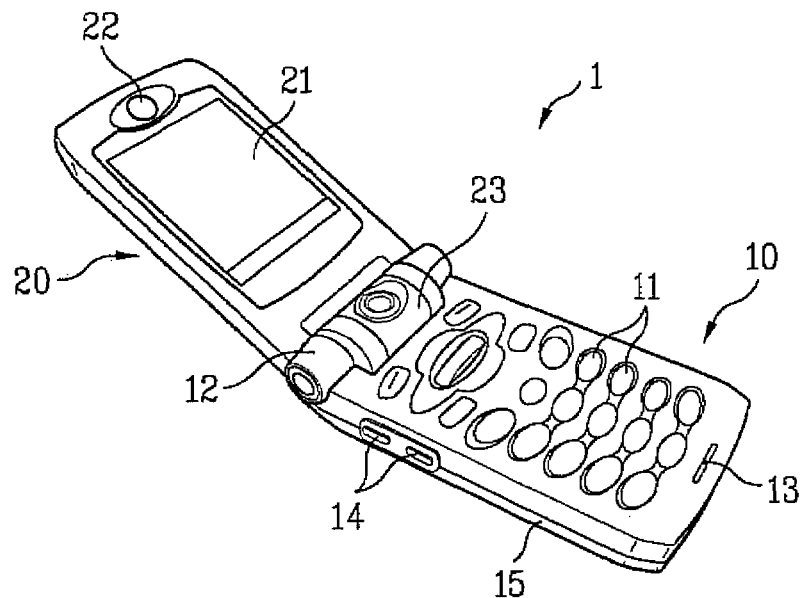
FIG. 1 is a perspective view of a conventional folder-type mobile telecommunication terminal.
Figure 2:
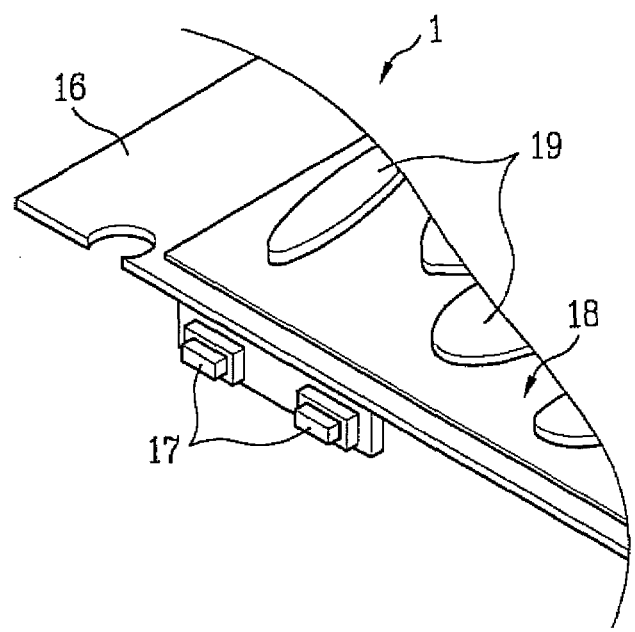
FIG. 2 is a partial perspective view of a side key portion of the mobile telecommunication terminal shown in FIG. 1.
Figure 3:
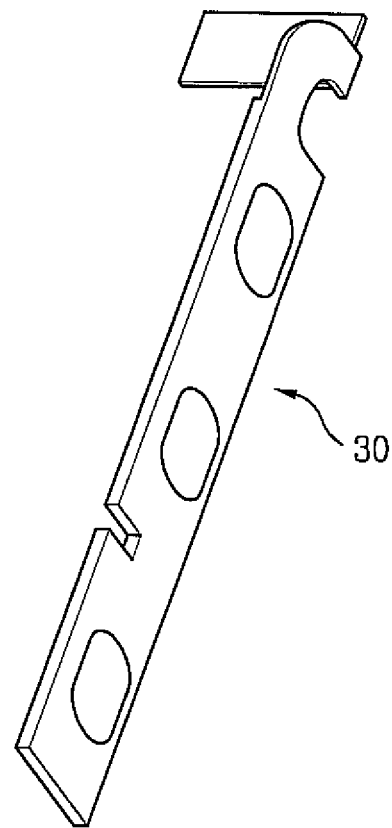
FIG. 3 is a perspective view of a conventional side key flexible printed circuit board (FPCB).
Figure 4:
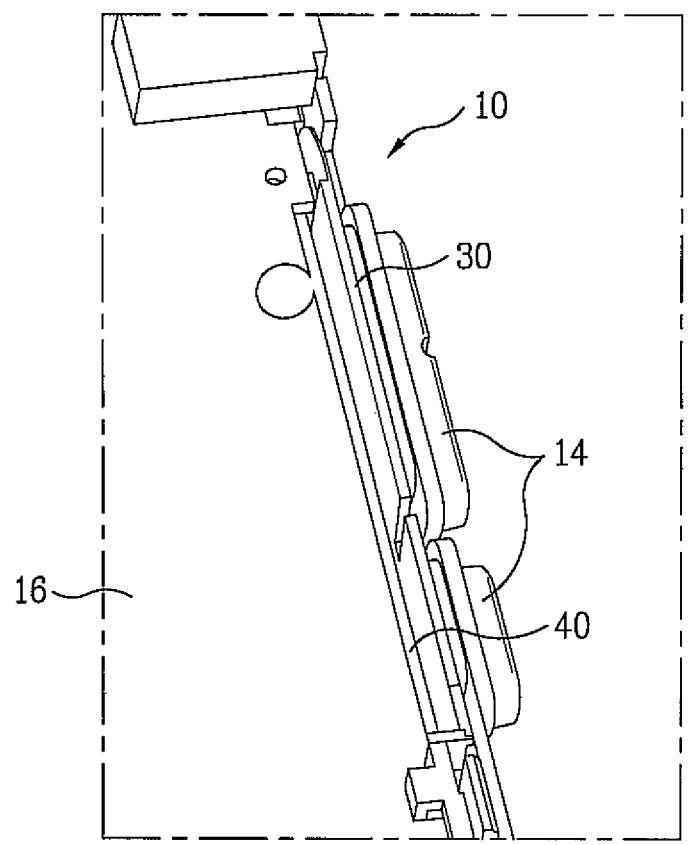
FIG. 4 is a partial perspective view of the side key FPCB shown in FIG. 3 connected to the first body.
Figure 5:
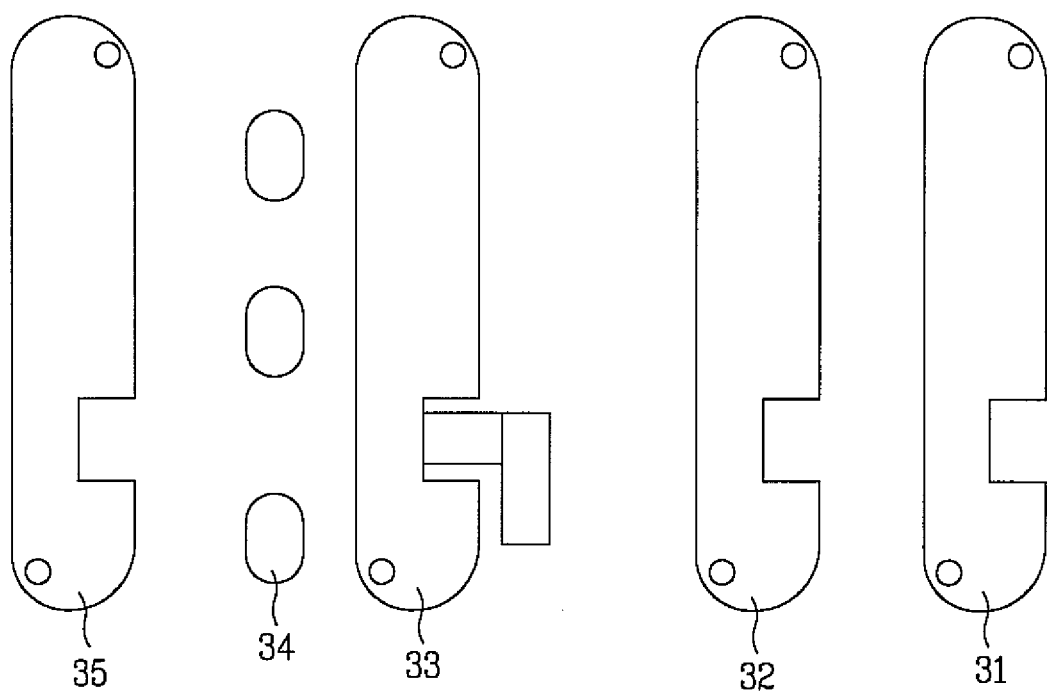
FIG. 5 is a schematic view illustrating a general structure of the conventional side key FPCB.
Figure 6:
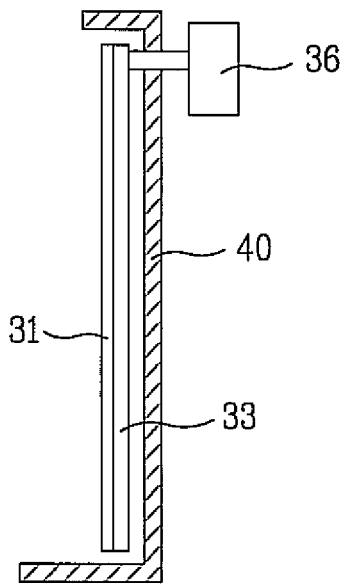
FIG. 6 is a side view illustrating an installed state of the side key FPCB shown in FIG. 5.
Figure 7:
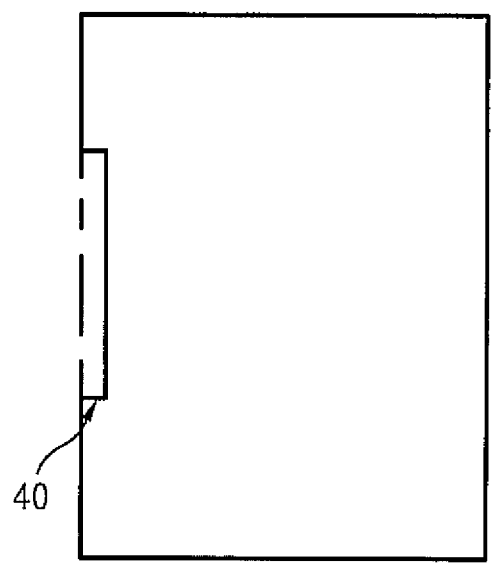
FIG. 7 is a schematic view illustrating a shape of a rib applied to a conventional straight side key FPCB and used by a mobile communication terminal having straight side surfaces.
Figure 8:
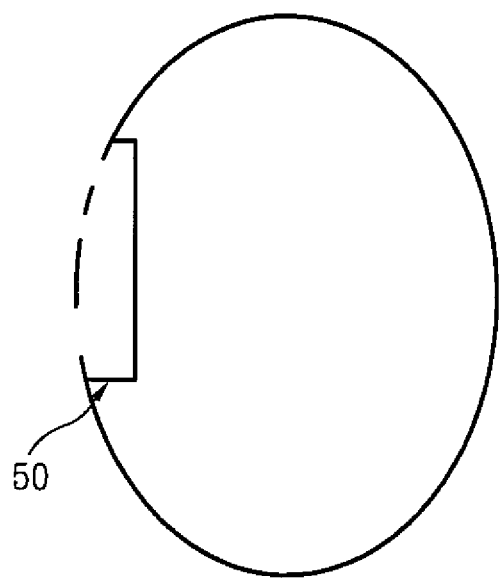
FIG. 8 is a schematic view illustrating a shape of a rib applied to a conventional straight side key FPCB and used by a mobile telecommunication terminal having curved side surfaces.
Figure 9:
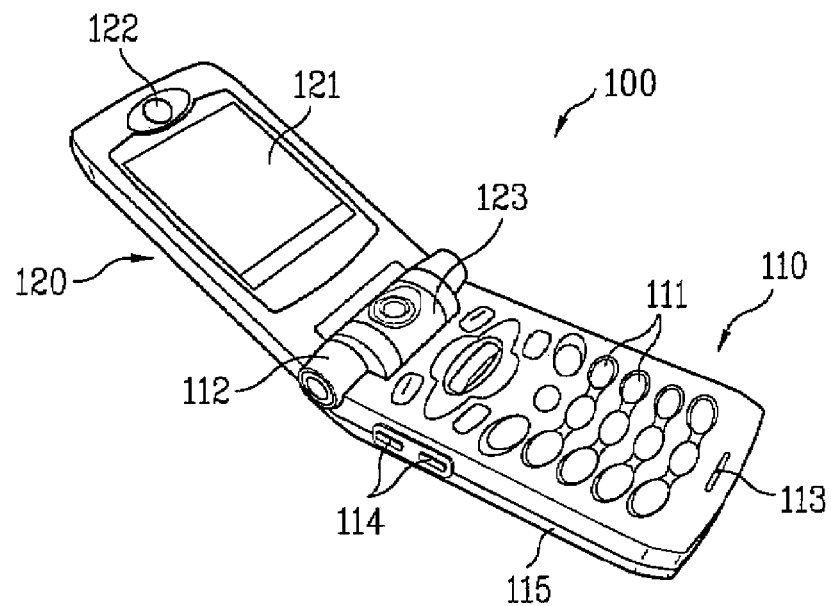
FIG. 9 is a perspective view of a folder-type mobile telecommunication terminal in accordance with one embodiment of the present invention.
Figure 10:
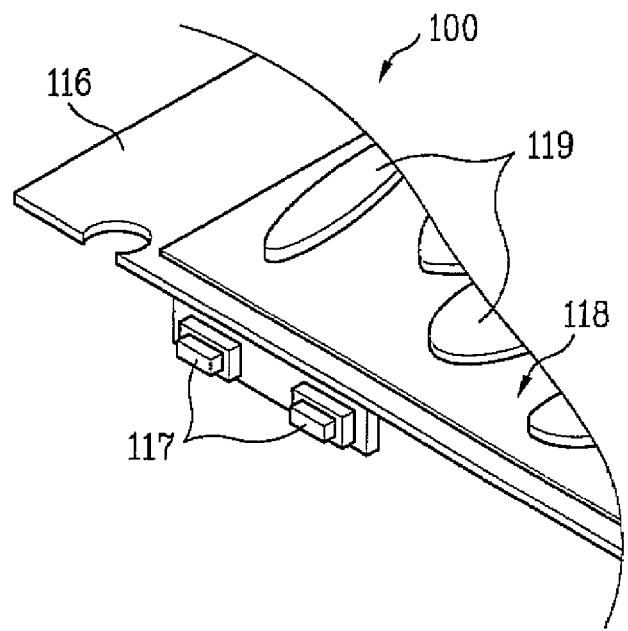
FIG. 10 is a partial perspective view of a side key portion of the mobile telecommunication terminal of FIG. 9.
Figure 11:
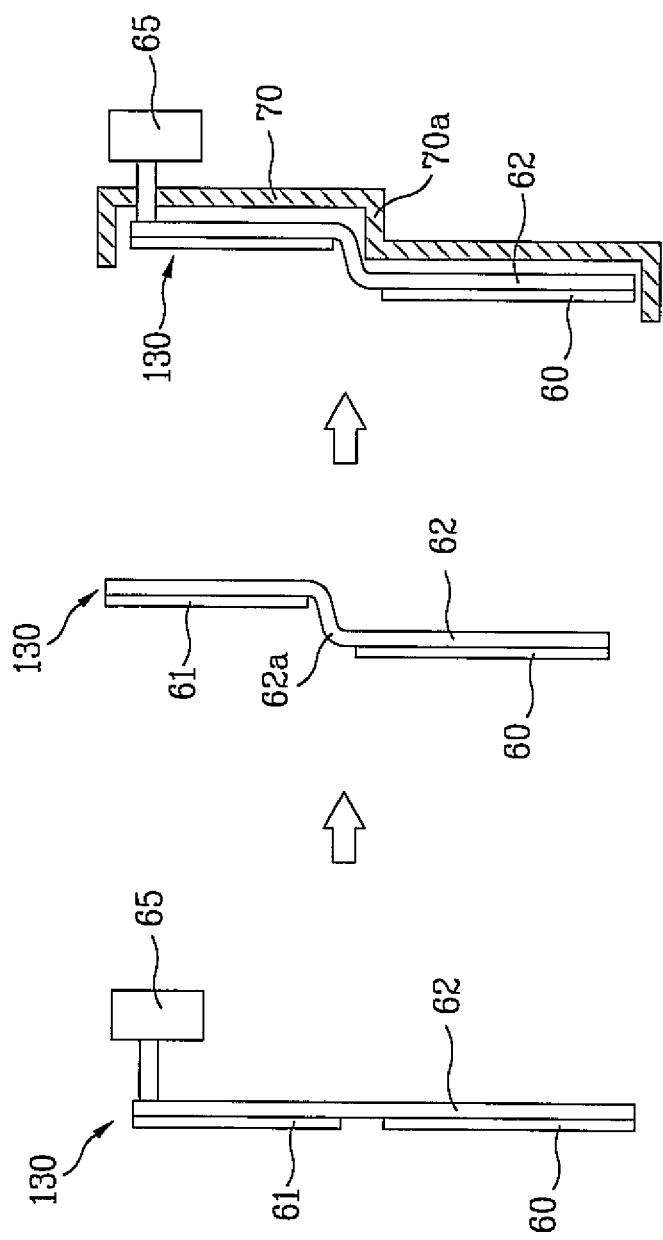
FIG. 11 is a side view illustrating an installed state of a side key FPCB in accordance with one embodiment of the present invention.
Figure 12:
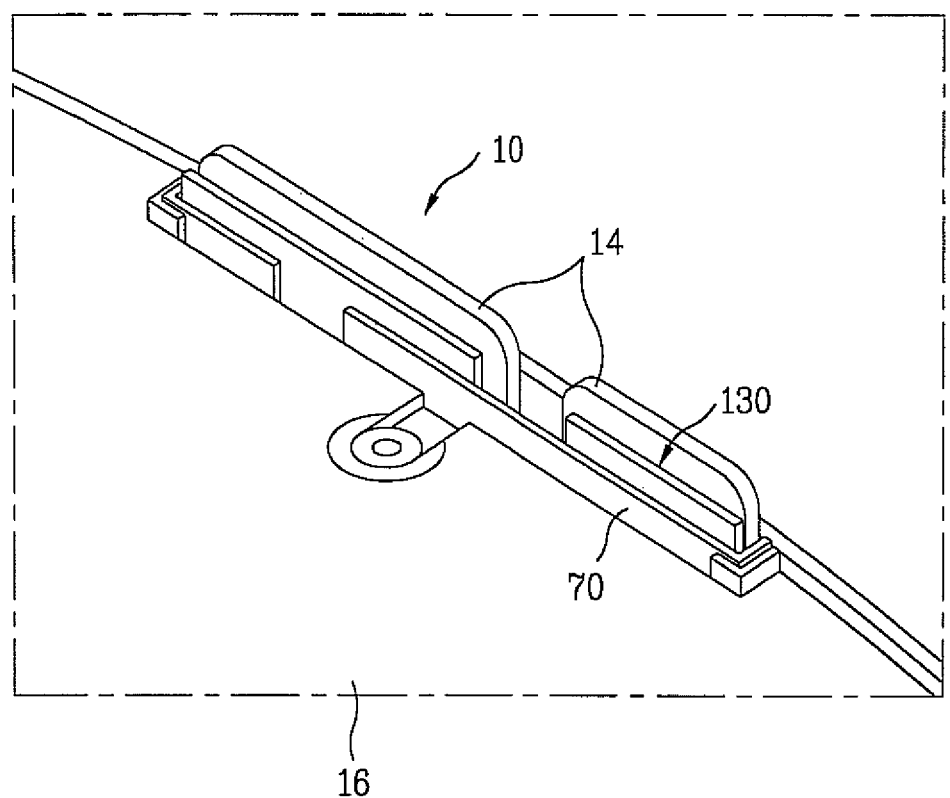
FIG. 12 is a partial perspective view of the side key FPCB connected to a first body in accordance with one embodiment of the present invention.

FIG. 9 is a perspective view of a folder-type mobile telecommunication terminal 100 in accordance with one embodiment of the present invention. FIG. 10 is a partial perspective view of a side key portion of the mobile telecommunication terminal of FIG. 9. FIG. 11 is a side view illustrating an installed state of a side key FPCB in accordance with one embodiment of the present invention. FIG. 12 is a partial perspective view of the side key FPCB connected to a first body 110 in accordance with one embodiment of the present invention. Referring to FIGS. 9-12, the side key FPCB 130 comprises an FPC 62 for operationally connecting with side keys 114 of the mobile telecommunication terminal 100. Preferably, dimple domes (not shown) may be mounted onto the FPC 62, via a PET film coating, for facilitating an electrical connection between the side keys 114 and the FPC 62.

Preferably, when the side keys 114 are pressed by the user, the side key FPCB 130 is activated to input signals into the mobile telecommunication terminal via the FPC 62, wherein the inputted signals may initiate any of various functions performed by the mobile telecommunication terminal 100. Preferably, the side keys 114 are attached to rear surfaces of two separated back plates 60 and 61 by an adhesive, such as double-sided tape for example. A rib 70 for structurally supporting the side key FPCB 130 within the mobile communication terminal is installed at a rear of the FPC 62.

Preferably, a portion of the FPC 62 passes through the rib 70, and is fixed to one side of a lower portion of the main PCB 116 by soldering at soldering point 65. Furthermore, the FPC 62 is made of a flexible material, and therefore may be bent at a central portion thereof at bending portion 62a in between the separated back plates 60 and 61. Accordingly, the rib 70 for structurally supporting the side key FPCB 130 comprises a bending portion 70a at a central portion thereof in between the separated back plates 60 and 61 for corresponding with the curved shape of the side key FPCB 130. Preferably, a side surface of the rib 70, to which the side key FPCB 130 is applied, can correspond to a curved shape of a mobile telecommunication terminal in which the side key FPCB 130 is mounted in, such as the mobile telecommunication terminal 200 having curved side surfaces shown in FIG. 13.

Although the number of the separated back plates 60, 61 shown in FIG. 11 is two, the number of separated back plates is not limited thereto. That is, the number of separated back plates may be three or more according to the number of side keys 114 serving as function keys on the mobile communication terminal. Preferably, when a plurality of separated back plates are used, each of the FPC 62 and the rib 70 has at least one bending portion corresponding to a space defined between each back plate.

For example, when two separated back plates are used, each of the FPC 62 and the rib 70 has one bending portion corresponding to a space defined between the two back plates. Furthermore, when three separated back plates are used, the FPC 62 and the rib 70 each have two bending portions respectively corresponding to two spaces defined between the first and second back plates and the second and third back plates, respectively.

Hereinafter, a function of the above-described side key FPCB 130 of the present invention will be described. As described and shown in FIGS. 11 and 12, the two separated back plates 60 and 61 are prepared, and the FPC 62 is attached to the rear surfaces of the back plates 60 and 61 via an adhesive, for example.

The FPC 62 is made of a flexible material and may be bent at the bending portion 62a in between the separated back plates 60 and 61. The rib 70 for structurally supporting the side key FBCB 130 within the mobile communication terminal is separated from the FPC 62 by a designated interval. Furthermore, the rib 70 comprises a bending portion 70a at a central portion thereof for corresponding with the bending portion 62a of the side key FPCB 130. Preferably, the side key FPCB 130 has a solid structure and is provided with one soldering point 65 for connecting to the main PCB 116 of the mobile communication terminal 100. As such, the side key FPCB 130 having the bending portion 62a along with the rib 70 having the bending portion 70a can be applied to a mobile communication terminal 200 having curved side surfaces, as shown in FIG. 13.

Accordingly, a space occupied by the side key FPCB 130 within the mobile communication terminal having the curved structure is not large. Notably, the FPC 62 having the bending portion 62a and a curved shape formed at the central portion thereof between the separated back plates 60 and 61 is similar to the curved or bent shape of the rib 70.

As described above, a side key FPCB, does not occupy a large space, and comprises an FPC and a rib connected to at least two separated back plates, each of which has at least one bending portion formed at the central portion thereof corresponding to a connection portion between the two separated back plates, thereby being applicable to a mobile telecommunication terminal having curved side surfaces without increasing the number of soldering points.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile communication terminal, comprising:
   a plurality of side keys for inputting data;
   a body having at least one curved or stepped side surface and a curved or stepped mounting space for mounting the side keys under the side surface;
   a flexible printed circuit for electrically connecting the plurality of side keys to the mobile communication terminal and comprising at least one bending portion;

a plurality of back plates, wherein each back plate corresponds to at least one of the plurality of side keys for supporting the at least one of the plurality of side keys within the curved or stepped mounting space the plurality of side keys are mounted in; and a rib for structurally supporting the at least one of the plurality of side keys within the curved or stepped mounting space, wherein the rib comprises at least one bending portion facilitating a shape of the rib to conform with the shape of the curved or stepped mounting space, and wherein each of the at least one bending portion of the rib respectively corresponds with each of the at least one bending portion of the flexible printed circuit, wherein the flexible printed circuit and the rib are positioned adjacent to each other within the curved or stepped mounting space so that each of the at least one bending portion of the rib is adjacent to the respectively corresponding bending portion of the flexible printed circuit, wherein the flexible printed circuit connects the plurality of back plates to each other by attaching to a surface of the back plates and wherein the at least one bending portion of the flexible printed circuit is positioned between the back plates.

2. The mobile communication terminal of claim 1, wherein a shape of the rib conforms with the shape of the curved or stepped mounting space the plurality of function keys are mounted in.

3. The mobile communication terminal of claim 1, wherein the rib has a curved shape or a stepped shape, wherein the stepped shape comprises at least one 90-degree bend.

4. The mobile communication terminal of claim 1, wherein the flexible printed circuit attaches to the plurality of plates via an adhesive.

5. The mobile communication terminal of claim 1, further comprising dimple domes mounted on the flexible printed circuit for electrically connecting the plurality of side keys to the flexible printed circuit.

6. The mobile communication terminal of claim 5, wherein the dimple domes are mounted onto the flexible printed circuit by a PET film coating.

7. The mobile communication terminal of claim 1, wherein the flexible printed circuit is electrically connected to the mobile communication terminal at one point.

8. The mobile communication terminal of claim 1, wherein the bending portion comprises N (N≧1) bending portions and the back plates comprises N+1 back plates.

9. The mobile communication terminal of claim 1, wherein the plurality of side keys are electrically connected to the mobile communication terminal via one end point of the flexible printed circuit.

* * * * *